United States Patent
Cheben et al.

(10) Patent No.: US 7,163,769 B2
(45) Date of Patent: Jan. 16, 2007

(54) PHOTOSENSITIVE MATERIAL AND PROCESS OF MAKING SAME

(76) Inventors: Pavel Cheben, 172 Stewart St., Ottawa, Ontario (CA) K1N 6J8; Maria Luisa Calvo, C/Valdivieso, No. 13, 21, Madrid (ES) 20823

(*) Notice: Subject to any disclaimer, the term of this patent is extended or adjusted under 35 U.S.C. 154(b) by 0 days.

(21) Appl. No.: 10/507,100

(22) PCT Filed: Mar. 11, 2003

(86) PCT No.: PCT/CA03/00333

§ 371 (c)(1),
(2), (4) Date: Sep. 10, 2004

(87) PCT Pub. No.: WO03/077033

PCT Pub. Date: Sep. 18, 2003

(65) Prior Publication Data

US 2005/0161645 A1  Jul. 28, 2005

Related U.S. Application Data

(60) Provisional application No. 60/363,038, filed on Mar. 11, 2002.

(30) Foreign Application Priority Data

Mar. 11, 2002  (CA) .................... 2375959

(51) Int. Cl.
G03F 7/00 (2006.01)
G03F 7/004 (2006.01)
G03F 7/075 (2006.01)

(52) U.S. Cl. .............. 430/1; 430/270.1; 430/321; 524/492

(58) Field of Classification Search .............. 430/1, 430/321, 270.1; 524/492
See application file for complete search history.

(56) References Cited

U.S. PATENT DOCUMENTS

| 5,977,241 | A  | * | 11/1999 | Koloski et al. | 524/502 |
| 6,268,089 | B1 | * | 7/2001  | Chandross et al. | 430/1 |
| 6,277,304 | B1 | * | 8/2001  | Wei et al. | 252/500 |
| 6,548,590 | B1 | * | 4/2003  | Koloski et al. | 524/492 |
| 6,579,477 | B1 | * | 6/2003  | Belleville et al. | 264/1.7 |
| 6,608,129 | B1 | * | 8/2003  | Koloski et al. | 524/403 |

(Continued)

FOREIGN PATENT DOCUMENTS

EP  938027 A1 *  8/1999

OTHER PUBLICATIONS

Cheben et al : "Photopolymerizable Glass With Diffraction Efficiency Near 100% For Holographic Storage " Appied Physics Letters, American Institute of Physics, New York, NY vil. 78 No. 11, Mar. 12, 2001. pp. 1490-1492.*

(Continued)

*Primary Examiner*—Amanda Walke
(74) *Attorney, Agent, or Firm*—Thomas Adams

(57) ABSTRACT

A photosensitive material, suitable for image-wise recording, e.g., holographic recording of data or other information, comprises an organic species in an organic-inorganic matrix, the organic species comprising a material having a refractive index which changes upon exposure to actinic radiation. The organic-inorganic matrix may be an organically modified glass. The photo-sensitive material may be made using the sol-gel process.

23 Claims, 1 Drawing Sheet

U.S. PATENT DOCUMENTS

| | | | |
|---|---|---|---|
| 6,610,808 B1 * | 8/2003 | De et al. | 526/281 |
| 6,632,897 B1 * | 10/2003 | Geiter et al. | 526/107 |
| 6,924,339 B1 * | 8/2005 | De et al. | 525/328.8 |
| 2002/0004172 A1 * | 1/2002 | Maeda et al. | 430/1 |
| 2002/0123592 A1 * | 9/2002 | Zhang et al. | 528/10 |
| 2005/0161645 A1 * | 7/2005 | Cheben et al. | 252/586 |

OTHER PUBLICATIONS

Cheben et al : "Holographic Diffraction Gratings Recording in Organically Modified Silica Gels", Optics Letters, vol. 21, No. 22, Nov. 15, 1996, pp. 1857-1859.*

* cited by examiner

PHOTOSENSITIVE MATERIAL AND PROCESS OF MAKING SAME

CROSS-REFERENCE TO RELATED APPLICATIONS

This application claims priority from U.S. Provisional patent application No. 60/363,038 filed Mar. 11, 2002, the contents of which are incorporated herein by reference.

BACKGROUND OF THE INVENTION

1. Technical Field

The invention relates to photosensitive materials and processes for making same and is especially, but not exclusively, applicable to photosensitive materials suitable for image-wise recording, for example holographic recording of data or volume holograms.

2. Background Art

There are many substances that are known to be photosensitive and suitable for holographic image recording. Those include silver halides, photopolymers, dichromated gelatins, and photorefractive, ferromagnetic, photochromic, photodichroic and azo-dye materials. In these materials, temporary or permanent changes of real or imaginary part of refractive index are induced upon-illumination of the material by actinic radiation and, typically, subsequent processing steps are required.

For high-resolution phase imaging such as that required in practical holographic data storage devices, there are several properties that an optimum recording material should exhibit. These include high dynamic range and sensitivity, high resolution, negligible shrinkage upon holographic exposure, low noise, phase image forming mechanism, image and dimensional stability, and fabricability into thick films and monoliths, to name the most relevant ones. However, to meet all these properties in a single material is a significant challenge that has not been satisfactorily overcome up to present and lack of such medium is currently considered in the art as one of the main hurdles in development of practical holographic data storage systems. A comprehensive review of holographic recording materials for data storage applications can be found in Holographic recording materials for optical data storage, by P. Cheben, in Advanced Optics, Chapter 1, pp. 565–609 (Ariel, Barcelona, 2002).

Existing Techniques

Photopolymers are believed to be promising holographic recording materials for applications such as display or security holograms, Write-Once Read-Many times (WORM) holographic memories, or Holographic Optical Elements (HOEs). A number of photopolymerizable systems have been developed up to present, such as those disclosed in U.S. Pat. Nos. 3,658,526; 4,942,112; 4,959,284 and 4,994,347 assigned to E. I. Du Pont de Nemours and Company, U.S. Pat. Nos. 4,588,664; 4,696,876 and 4,970,129 assigned to Polaroid Corporation, U.S. Pat. No. 3,993,485 assigned to Bell Telephone Laboratories, U.S. Pat. No. 4,173,474 assigned to Cannon Kabushiki Kaisha, and U.S. Pat. No. 3,694,218 assigned to Hughes Aircraft Company. Another promising class of materials are porous glasses impregnated by photopolymerizable materials such as those disclosed in Spanish patent P9700217 assigned to the Instituto Nacional de Tecnica Aeroespacial, Japanese patents JP6148880 assigned to Nippon Sheet Glass Co. Ltd. and JP61141476A assigned to Sony Corp.

Limitations or Drawbacks of Existing Techniques

Application of photopolymers to volume holography and data storage is severely limited due to their limited thickness, high shrinkage during holographic exposure and need for solvent processing. A recording medium of millimeter thickness or more and exhibiting high photoinduced refractive index change is required to achieve high storage density by recording multiple volume holograms, separated from each other by the Bragg effect, in the same spatial location.

The most important limitations are imposed by organic polymeric binders that limit thickness of the medium, usually to less than a few hundred microns, and temperature- and light-induced dimensional changes that can distort the holograms and degrade the fidelity with which the stored images can be retrieved. An approach to prepare thicker photopolymers is to use resins consisting of two independent photopolymerisable systems such as those disclosed in L. Dhar et al., Opt. Lett. 24, pp. 487–489 (1999), , in which matrix-forming oligomers are first precured to a gel state and then the hologram is recorded by photoinduced polymerization of monomers dissolved in the resin. However, this approach does not simultaneously achieve high dimensional stability and maximum photoinduced refractive index change. To increase the rigidity of the material, higher levels of precuring are required, which decreases diffusional mobility of the monomer in the resin and degrades holographic properties of the photopolymer. In addition, some monomeric species are inevitably consumed (polymerized) during the precuring step, which in turn reduces dynamic range of the holographic recording and, ultimately, limits the data storage capacity of the material.

Porous glasses such as those fabricated by sol-gel technique appear to be promising for data storage as they can typically be fabricated as bulk monoliths. However, the materials disclosed up to present, including Spanish patent P9700217 assigned to the Instituto Nacional de Tecnica Aeroespacial, Japanese patents JP6148880A assigned to Nippon Sheet Glass Co. Ltd. and JP61141476A assigned to Sony Corp. suffer from drawbacks ranging from insufficient sensitivity and dynamic range for practical applications to insufficient optical quality and thickness.

SUMMARY OF THE INVENTION

The present invention seeks to at least ameliorate the disadvantages of such known materials, or at least provide an alternative.

According to the present invention, a photosensitive material comprises a host matrix formed by an inorganic network and an organic-inorganic network interpenetrating each other, the host matrix containing at least one organic species having a refractive index which changes upon exposure to actinic radiation.

The organic species may comprise an efficient organic photosensitive and photoinitiating species together with a monomer or a mixture of monomers.

The organic-inorganic matrix may comprise an organically modified glassy host with the organic species dispersed therein and/or chemically-bonded thereto. The organically modified host of embodiments of the present invention may provide desired optical quality and physical and chemical stability.

The organic species may be bonded to the organic-inorganic matrix by covalent bonding.

Alternatively, the organic species may be a dispersion in the organic-inorganic host.

The at least one organic species can be impregnated or entrapped as a guest within organic-inorganic matrix.

According to a second aspect of the invention, there is provided a process of making a photosensitive material comprising the steps of forming a host matrix comprising an inorganic network and an organic-inorganic network interpenetrating each other, the host matrix containing at least one organic species having a refractive index that changes on exposure to actinic radiation.

Preferably, in embodiments of either aspect of the invention, the photosensitive material is formed using a sol-gel process.

The preferred manufacturing process, namely the sol-gel technique, is well known in the art, and has been widely used in the preparation of oxide glasses by hydrolysis and condensation of metal alkoxides since the first synthesis of silica from silicon alkoxide was reported by Ebelmen in 1844. Given that the sol-gel process can take place at room temperature, it may be used to incorporate an organic species, e.g., organic molecules with low thermal stability, into an inorganic or organic-inorganic matrix, e.g., a glassy host.

The organic species may be dispersed in an organically-modified host over domains of several nanometers, which results in a material exhibiting very low optical scattering, even if the refractive indices of the organic species differ from that of the host matrix. The host matrix is a crucial component affecting physical properties of the photosensitive material, such as its rigidity, resistance to cracking, environmental stability, reduction of dimensional changes upon holographic exposure, and maximum achievable thickness. It also affects optical properties of the composite, including bulk refractive index, optical homogeneity and photoinduced refractive index change.

The foregoing and other objects, features, aspects and advantages of the present invention will become more apparent from the following detailed description, in conjunction with the accompanying drawings, of preferred embodiments of the invention, which are described by way of example only.

DESCRIPTION OF THE PREFERRED EMBODIMENTS

Figure 1:
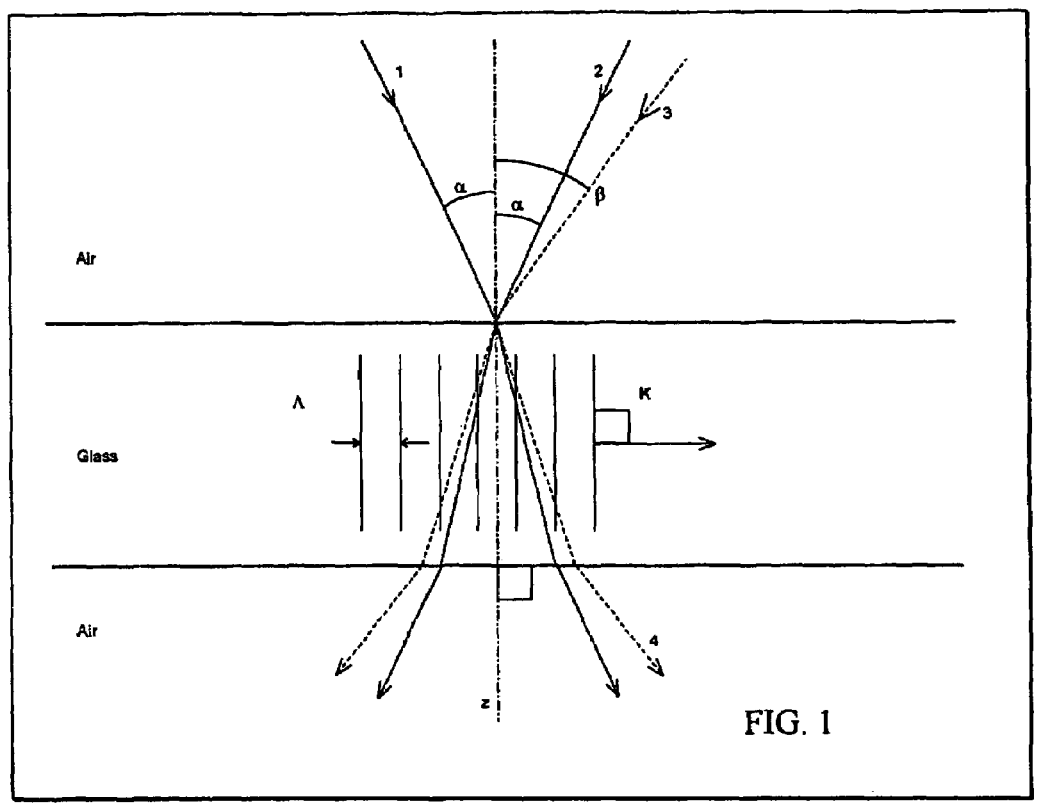
FIG. 1 illustrates geometry used for glass characterization by holographic grating recording.

Embodiments of the invention disclosed herein include a photosensitive material and a process of fabricating same that provide a high resolution and stable phase image recording properties. Using the sol-gel process, the material may be prepared by incorporating photosensitive and photopolymerizable organic species, as dopants, into a solution of one or more liquid glass precursors and the latter transformed via controlled hydrolysis and polycondensation reactions into a solid material of a high optical quality. High optical quality and excellent imaging properties such as high dynamic range, sensitivity, resolution and image stability may be achieved by a combination of efficient photosensitive and phototopolymerizable species with an organically modified host matrix.

The organic-inorganic matrix may comprise a hybrid network synthesized by using organo alkoxysilanes as one or more of the precursors for the sol-gel reaction in which organic groups are introduced within an inorganic network through the Si—C-bond. Alternatively, the organic-inorganic matrix can be formed via the co-condensation of functionalized oligomers or polymers with metal alkoxides in which chemical bonding is established between inorganic and organic phases.

The organic-inorganic matrix can also be synthesized through the formation of inorganic species within a polymer matrix. Specifically, inorganic species, generally in the form of particles with a characteristic size of a few hundred angstroms, can be generated in situ within the polymer matrix by first swelling cross-linked, ionomeric, or crystalline polymeric host with a compatible solution containing metal alkoxides followed by the promotion of the sol-gel reaction of the inorganic.

Yet another alternative would be to obtain the organic-inorganic matrix by either the infiltration of previously formed oxide gels with polymerizable organic monomers or the mixing of polymers with metal alkoxides in a common solvent.

The matrix can also be formed by interpenetrating networks and simultaneous formation of inorganic and organic phases. By using triethoxysliane $R'Si(OR)_3$ or diethoxysilanes $R'R''Si(OR)_2$ as the precursor with $R'$ and $R''$ being a polymerizable group such as an epoxy group, an organic network can be formed within the inorganic network by either photochemical or thermal curing of such groups.

Yet another process is to form the matrix from inorganic/organic simultaneous interpenetrating networks, where both inorganic glass and polymer formation occur concurrently. Such transparent composites may be synthesized through a synchronous application of the aqueous ring-opening metathesis polymerization of cyclic alkenyl monomers and the hydrolysis and condensation of metal alkoxides.

Other ways of making the matrix include employing polymerizable monomers as the cosolvents such that all the components (i.e. the monomers and sol-gel precursors) contribute either to the inorganic matrix or to the organic polymer matrix, which together form the organic-inorganic matrix, to avoid large scale shrinkage.

In a preferred embodiment of this invention, the organic-inorganic matrix is achieved by copolymerization of epoxysilanes such as (3-glycidoxypropyl)trialkoxysilane with a tetraalkoxysilane in the presence of dispersed photosensitive, photoinitiating and photopolymerizable species.

The organic-inorganic matrix is a crucial component affecting physical properties of the photosensitive material, such as its rigidity, resistance to cracking, environmental stability, elimination of dimensional changes upon holographic exposure, maximum achievable thickness, and optical properties of the composite, including bulk refractive index, optical homogeneity and photoinduced refractive index change.

A wide variety of free radical or cationic initiators can be used to initiate polymerization while the photoactivation of initiator molecules can be achieved by a number of sensitizing molecules well known in the art. A review of free-radical photoinitiators can be found for example in Photoinitiators for free-radical-initiated photoimaging systems, by B. M. Monroe and G. C. Weed, Chemical Reviews, vol. 93, pp. 435–448, (1993). A large number of sensitizers and initiators providing blue, green, red and near infra-red sensitivity can be used in the implementations of this invention, including halogen-substituted acetophenones, chromophore-substituted triazines, azo dies, benzoin ethers, ketals, o-acylated oximino ketones, acylphosphine oxides, aromatic ketones, hexaarylbisimidazoles, bis(p-dialkylaminobenzilidene)ketones, thioxanthones, ketocoumarins, 9-phenylacridine, die-sensitized systems such as xantene, acridinium; phenazine and thiazine dyes in combination with activators such as amines, sulfinates, enolates, carboxylates and organotine compounds, dye-borate complexes, ferrocenium salts, aluminate complexes, and protic acid generators.

Preferred sensitizers and initiators for use in embodiments of this invention include organometallic systems such as dicyclopentadienyltitanocenes, in particular bis(pentafluorophenyl)titanocene, titanocene/N-phenylglycine, and bis ($\mu^5$-2,4-cyclopentadien-1-yl)-bis-[2,6-difluoro-3-(1H-pyrrol-1-yl)phenyl]titanium; and bis(p-dialkylaminobenzilidene)ketones in combination with hexaarylbisimidazole initiating systems such as 2,2',4,4',5,5'-hexaarylbisimidazole with charge transfer agents such as 2-mercaptobenzoxazole. Concentration of the sensitizer and initiator in the matrix is from 0.001 to 10%, preferably from 0.01 to 5% depending on thickness of the material.

A wide variety of ethylenically unsaturated monomers or oligomers capable of free radical addition polymerization can be used in embodiments of this invention. Acrylate and methacrylate monomers are preferred because of their high propagation and low termination rates. Liquid monomers are preferred, but solid monomers can be used either alone or in combination with a liquid monomer, provided that solid monomer is soluble in the sol-gel matrix. Furthermore, monomers with high molar refraction are preferred as they maximize the refractive index change per one diffusing monomer molecule upon holographic exposure. Advantageously, the monomers have good solubility in silica sol without degrading the optical and mechanical properties of the composite. Suitable monomers include but are not limited to phenyl acrylate, 2-phenoxyethyl acrylate, N-vinylcarbazol, isobornyl acrylate, 3,6-dibromo-9-vinyl carbazol, p-chlorophenyl acrylate, hexanediol diacrylate, vinyl benzoate, tert-butyl hydroperoxide, hexanediol diacrylate, 2,4,6-tribromophenyl acrylate, phenyl acrylate, orthobiphenyl acrylate, orthobiphenyl methacrylate, di(2-acryloxyethyl) ether of bisphenol-A, 2-phenylethyl acrylate, di-(p-clorophenoxy)ethyl acrylate, and pentachlorophenyl acrylate. Other suitable monomers are multifunctional monomers containing two or more ethylenically unsaturated groups. Monomers of this type include but are not limited to ethylene glycol diacrylate, diethylen glycol diacrylate, 1,4-butanediol diacrylate, decamethylene glycon diacrylate, 1,4-cycolhexanediol diacrylate, glycerol diacrylate, glycerol triacrylate, ethylene glycol dimethacrylate, butylene glycol dimethacrylate, tripropylene glycol diacrylate, di(2-acryloxyethyl) ether of bisphenol-A, di(2-acryloxyethyl) ether of tetrabromo-bisphenol-A. Other suitable monomers are those capable of cationic ring opening polymerization (CROP). Such CROP monomers have two or more cyclohexene oxide groups linked through siloxane chain segments, for example such as 1,3-bis[2-(3{7-oxabicyclo[4.1.0]heptyl})ethyl]-tetramethyl disiloxane. Polymerization of such monomers can be initiated by strong protic acids that are generated during the photo decomposition of, for example, sulfonim or iodonium salts. Concentration of the monomers in the glass is from 5 to 70%, preferably 20–50%.

General Procedures

Sensitizing and photoinitiating species and monomer were added into sol-gel starting solution containing one or more hydrolyzed sol-gel precursors and an acidic catalyst, prior to the gelation point. After vigorously stirring the solution for about 20 minutes at about 40° C., a homogeneous solution was obtained. It was then cast into Teflon or glass vials and allowed to gel and dry for about 10 days at about 60° C. Dry monoliths were polished to optical-grade slabs of thickness up to several mm. Films of thickness up to 500 Υm were prepared by casting the solution onto a borosilicate glass plate. The films were dried for about 5 days at about 60° C.

The given preparation times and temperature are typical for the examples provided in this invention but are not to be taken by way of limitation; rather they can be varied as is well known in the art.

To characterize holographic performance of the glass, plane gratings were recorded in the glass by two mutually coherent plane-wave writing beams 1 and 2, as illustrated in FIG. 1. The writing beams of wavelength 514.5 or 488 nm, were from an Ar-ion laser operating in a single longitudinal and transversal mode. The grating growth was studied during and after the holographic exposure by diffraction of read-out beam 3. The angle of incidence of the read-out beam was set to satisfy the first-order Bragg condition at which the intensity of the first-order diffracted beam (beam 4) and thus, diffraction efficiency η, is maximized. To minimize a possible photochemical influence of the read-out beam, a low-intensity (0.8 mW/cm$^2$) beam of 632.8 nm wavelength (from a He—Ne laser) at which the absorption of the photoinitiator is low, was used. In the experiments, polarization of the writing and read-out beams was perpendicular ('s' polarization) to the plane defined by the sample normal and wave vectors of the writing beams, but 'p' polarization can also be used.

After the holographic exposure, the samples were kept in the dark for 15 minutes to allow any dark reactions to subside. The photoreaction was then completed by uniformly exposing the sample 5 minutes to UV light (wavelength 254 nm from a low-pressure mercury vapor lamp. The diffraction efficiency dependence on the angle of incidence was measured by detuning from the Bragg condition. This measurement yields the grating angular selectivity □ defined as full-width at half-maximum (FWHM) of the angular selectivity curve. The refractive index modulation amplitude of the grating was calculated from the diffraction efficiency and angular selectivity data using Kogelnik's coupled-wave theory (H. Kogelnik, *Bell Syst. Tech. J.* 48, p. 2909, 1969).

The mechanism of grating formation can be explained by the models developed for holographic photopolymers (W. S. Colburn, Appl. Opt. 10, p. 1636, 1971; G. Zhao and P. Mouroulis, J. Mod. Opt. 41, p. 1929, 1994). The monomer polymerization starts and proceeds preferentially in the light regions of the illumination pattern. The depletion of the monomer in the light regions sets-up a spatial concentration gradient resulting in a diffusional flux of monomer molecules from the dark to the light regions, along the grating vector. In addition, it is well known in the art that acrylic monomers shrink on polymerization. As the monomer molecules, separated at van der Walls distances, are converted to covalently bonded polymer, voids are created in the light regions, and the resulting capillary forces draw the fresh monomer from the dark to the light regions. This process continues until either there is no more unreacted monomer in the dark regions or transport of monomer is hindered by increased rigidity of the polymer in the polymerized regions. Ultimately, permanent compositional and density changes and associated refractive index modulation are induced in the material. It is known that the diffusion of monomer is a critical mechanism in the formation of holographic gratings in photopolymerizable materials. A porous matrix advantageously provides for efficient liquid monomer transport.

Embodiments of the present invention provide a new class of photosensitive material providing a significant advance in the field of research on holographic recording materials. The material has unprecedented refractive index modulation capability for a thick photopolymerizable material. The holograms stored in the material are permanent and stable; the constancy of Δn over a period of 12 months at room temperature having been demonstrated. An additional advantage of the material, as compared to holographic photopolymers, is that it can be easily fabricated into samples of high optical quality and thickness of several millimetres. The failure of the prior art attempts to make photopolymers of such a thickness with required holographic properties has been considered the main obstacle in development of holographic write-once memories. In contrast, photosensitive materials embodying the present invention exhibit both excellent holographic properties and ease of fabrication into crack-free thick films or monoliths of high optical quality, as required for holographic storage applications.

Advantageously, characteristics required for volume holographic recording, including photosensitivity, high refractive index modulation, desired material thickness, high optical quality, and dimensional and mechanical stability, are achieved by embodiments of the invention which employ a combination of an organic species, for example an organic photosensitive, photoinitiating and monomeric species, within an organic-inorganic matrix, for example organically-modified, glass. A further advantage is that photosensitive materials embodying the present invention can be polished to optical-grade.

Although the above-described preferred embodiments of the invention refer to phase holographic recording, the invention is applicable to amplitude holographic recording and, indeed, other forms of image-wise refractive index and/or absorption recording.

The preferred manufacturing process, namely the sol-gel technique, that can take place at room temperature, may be used to incorporate an organic species, e.g. organic molecules with low thermal stability, into an organic-inorganic matrix, e.g., organically modified glass.

EXAMPLES

Samples 1–2.
  Organic-inorganic matrix: copolymerized 3-glycidoxypropyltrimethoxysilane and tetramethyl orthosilicate, 1350 mg,
  Monomer: phenyl acrylate, 830 mg,
  Initiator: bis($\mu^5$-2,4-cyclopentadien-1-yl)-bis-[2,6-difluoro-3-(1H-pyrrol-1-yl)phenyl]titanium, 21 mg.

Sample 3.
  Organic-inorganic matrix: copolymerized 3-glycidoxypropyltriethoxysilane and tetraethyl orthosilicate, 1350 mg,
  Monomers: 2-phenoxyethyl acrylate, 580 mg, and N-vinylcarbazol, 40 mg,
  Initiator: bis($\mu^5$-2,4-cyclopentadien-1-yl)-bis-[2,6-difluoro-3-(1H-pyrrol-1-yl)phenyl]titanium, 15 mg.

Sample 4.
  Organic-inorganic matrix: copolymerized 3-glycidoxypropyltriethoxysilane, tetraethyl orthosilicate, and methacryloxypropyl triethoxysilane, 1350 mg,
  Monomers: isobornyl acrylate, 750 mg,
  Initiator system: 2,5-bis[[(4-diethylamino)phenyl]methylene]cyclopentanone, 0.4 mg, hexaarylbiimidazole, 40 mg, and 2-mercaptobenzoxazole, 50 mg.

Holographic properties of these compositions are summarized in Table 1.

| Sample number | T [μm] | SF [lp/mm] | P [mW/cm$^2$] | λ [nm] | Δn |
|---|---|---|---|---|---|
| 1 | 270 | 350 | 90 | 514.5 | $4.6 \cdot 10^{-3}$ |
| 2 | 320 | 1230 | 70 | 514.5 | $4.4 \cdot 10^{-3}$ |
| 3 | 1100 | 350 | 80 | 514.5 | $1.4 \cdot 10^{-3}$ |
| 4 | 260 | 350 | 70 | 488 | $3 \cdot 10^{-3}$ |

Where: T is the sample thickness, SF the grating spatial frequency, P the total power in both recording beams, λ the wavelength of actinic radiation, and Δn the measured refractive index modulation of the grating.

Although embodiments of the invention have been described and illustrated in detail, it is to be clearly understood that the same is by way of illustration and example only and not to be taken by way of the limitation, the spirit and scope of the present invention being limited only by the appended claims.

The invention claimed is:

1. A photosensitive material comprising a host matrix formed by an inorganic network and an organic-inorganic net-work interpenetrating each other, the host matrix containing at least one organic species having a refractive index which changes upon exposure to actinic radiation.

2. A photosensitive material according to claim 1, wherein the organic species comprises one or more of efficient organic photosensitive and photoinitiating species together with a monomer or a mixture of monomers and the host matrix comprises interpenetrating inorganic and organic-inorganic networks with the organic species dispersed therein or chemically-bonded thereto, or both dispersed therein and chemically-bonded thereto.

3. A photosensitive material according to claim 1, wherein the photosensitive material comprises a product of a sol-gel process.

4. A photosensitive material according to claim 1, wherein the organic species is selected from the group comprising halogen-substituted acetophenones, chromophore-substituted triazines, azo dies, benzoin ethers, ketals, o-acylated oximino ketones, acyl phosphine oxides, aromatic ketones, hexaarylbisimidazoles, bis(p-dialkylaminobenzilidene) ketones, thioxanthones, ketocoumarins, 9-phenylacridine, die-sensitized systems such as xantene, acridinium, phenazine and thiazine dyes in combination with activators such as amines, sulfinates, enolates, carboxylates and organotine compounds, dye-borate complexes, ferrocenium salts, aluminate complexes, protic acid generators such as sulfonium or iodonium salts capable of initiating cationic polymerization, and organometallic systems such as dicyclopentadienyltitanocenes, in particular bis(pentafluorophenyl)titanocene, titanocene/N-phenylglycine, and bis($^5$-2,4-cyclopentadien-1-yl)-bis-[2,6-difluoro-3-(1H-pyrrol-1-yt) phenyl]titanium; and bis(p-dialkylaminobenzilidene) ketones in combination with a hexaarylbisimidazole initiating system with charge transfer agents such as 2-mercaptobenzoxazole.

5. A photosensitive material according to claim 1, wherein the organic species is selected from the monomers capable of cationic polymerization and ethylenically unsaturated monomers capable of free radical addition polymerization.

6. A photosensitive material according to claim 5, wherein the monomers are selected from the group comprising phenyl acrylate, 2-phenoxyethyl acrylate, N-vinylcarbazol, 3,6-dibromo-9-vinyl carbazol, p-chlorophenyl acrylate, hexanediol diacrylate, vinyl benzoate, tert-butyl hydroperoxide, hexanediol diacrylate, 2,4,6-tribromophenyl acrylate, phenyl acrylate, orthobiphenyl acrylate, orthobiphenyl methacrylate, di(2-acryloxyethyl) ether of bisphenol-A, 2-phenylethyl acrylate, di-(p-clorophenoxy)ethyl acrylate, pentachlorophenyl acrylate, ethylene glycol diacrylate, diethylen glycol diacrylate, 1,4-butanediol diacrylate, decamethylene glycon diacrylate, 1,4-cyclohexanediol diacrylate, glycerol diacrylate, glycerol triacrylate, ethylene glycol dilmethacrylate, butylene glycol dimethacylate, tripropylene glycol diacrylate, di(2-acryloxyethyl) ether of bisphenol-A, di(2-acryloxyethyl) ether of tetrabromo-bisphenol-A, and monomers that have two or more cyclohexene oxide groups linked through siloxane chain segments, including 1,3-bis [2-(3{7-oxabicyclo[4.1.0]heptyl})ethyl]-tetramethyl disiloxane.

7. A material according to claim 1, wherein the organic-inorganic network comprises a material synthesized using organo alkoxysilanes as one or more of the precursors for a sol-gel reaction in which organic groups are introduced within an inorganic network through the ≡Si—C—"bond.

8. A material according to claim 1, wherein the host matrix material comprises, in the presence of dispersed photosensitive, photoinitiating and photopolymerizable species, interpenetrating networks obtained by copolymerization of an epoxysilane and either or both of a tetraalkoxysilane and a trialkoxysilane.

9. A material according to claim 8, wherein the epoxysilane is a (3-glycidoxypropyl)-trialkoxysilane.

10. A material according to claim 1, wherein the matrix comprises a said organic-inorganic network formed within said inorganic network by either photochemical or thermal curing thereof using a tetraalkoxysilane (Si(OR)$_4$) and either or both of trialkoxysilane R'Si(OR)$_3$ and dialkoxysilanes R'R"Si(OR)$_2$ as the precursor with R' and R" being a polymerizable group such as an epoxy group.

11. A material according to claim 1, wherein the matrix comprises a material formed as simultaneous interpenetrating networks, where both said inorganic network and said organic-inorganic network have been formed concurrently.

12. A process of making a photosensitive material comprising the steps of forming a host matrix comprising an inorganic network and an organic-inorganic network interpenetrating each other, the host matrix containing at least one organic species having a refractive index that changes on exposure to actinic radiation.

13. A process according to claim 12, wherein the process comprises a sol-gel process.

14. A process according to claim 12, wherein the organic-inorganic network is synthesized using organo alkoxysilanes as one or more of the precursors for a sol-gel reaction in which organic groups are introduced within an inorganic network through the ≡Si—C—"bond.

15. A process according to claim 12, wherein the matrix material is formed by copolymerization of an epoxysilane and either or both of a tetraalkoxysilane and a trialkoxysilane in the presence of dispersed photosensitive, photoinitiating and photopolymerizable species.

16. A process according to claim 15, wherein the epoxysilane used is a (3-glycidoxypropyl) trialkoxysilane.

17. A process according to claim 12, wherein the organic-inorganic network is formed as an organically modified network within the inorganic network by either photochemical or thermal curing thereof using a tetraalkoxysilane (Si(OR)$_4$) and either or both of trialkoxysilane R'Si(OR)$_3$ and dialkoxysilanes R'R"Si(OR)$_2$ as the precursor with R' and R" being a polymerizable group such as an epoxy group.

18. A process according to claim 12, wherein the matrix material is formed as simultaneous interpenetrating networks, where both inorganic network and organic-inorganic network formations occur concurrently.

19. A process according to claim 12, comprising the step of employing polymerizable monomers as the cosolvents such that all the components contribute either to the inorganic network or to the organic polymer.

20. A photosensitive material according to claim 1, wherein the host matrix is prepared by co-polymerization of sol-gel precursors of an inorganic network and an organic-inorganic network.

21. A material according to claim 1, wherein the host matrix material comprises, in the presence of dispersed photosensitive, photoinitiating and photopolymerizable species, interpenetrating networks obtained by copolymerization of a tetraalkoxysilane and a trialkoxysilane.

22. A process according to claim 12, wherein the host matrix is prepared by copolymerization of sol-gel precursors of an inorganic network and an organic-inorganic network.

23. A process according to claim 12, wherein the matrix is formed by copolymerization of a tetraalkoxysilane and a trialkoxysilane in the presence of dispersed photosensitive, photoinitiating and photopolymerizable species.

* * * * *